(12) United States Patent
Canfield et al.

(10) Patent No.: US 7,917,873 B1
(45) Date of Patent: Mar. 29, 2011

(54) SYSTEM AND METHOD FOR VERIFICATION OF INTEGRATED CIRCUIT DESIGN

(75) Inventors: William Canfield, Portland, OR (US);
Khalil Shalish, Austin, TX (US)

(73) Assignee: Zocalo Tech, Inc., Austin, TX (US)

( * ) Notice: Subject to any disclaimer, the term of this patent is extended or adjusted under 35 U.S.C. 154(b) by 463 days.

(21) Appl. No.: 12/029,683

(22) Filed: Feb. 12, 2008

Related U.S. Application Data

(60) Provisional application No. 60/900,826, filed on Feb. 12, 2007.

(51) Int. Cl.
*G06F 17/50* (2006.01)

(52) U.S. Cl. ......... 716/104; 716/103; 716/132; 716/136

(58) Field of Classification Search ......... 716/5; 703/16
See application file for complete search history.

(56) References Cited

U.S. PATENT DOCUMENTS

| | | | | |
|---|---|---|---|---|
| 5,905,664 | A * | 5/1999 | Ko et al. ................. | 708/491 |
| 6,295,623 | B1 * | 9/2001 | Lesmeister et al. ......... | 714/741 |
| 7,392,171 | B2 * | 6/2008 | Blasi et al. ............... | 703/15 |
| 7,506,281 | B1 * | 3/2009 | Secatch .................. | 716/4 |
| 2003/0125920 | A1 * | 7/2003 | Matsuoka et al. ........... | 703/15 |
| 2004/0078178 | A1 * | 4/2004 | Blasi et al. ............... | 703/15 |
| 2005/0022086 | A1 * | 1/2005 | Kotz et al. ............... | 714/742 |
| 2005/0060132 | A1 * | 3/2005 | Hollander et al. .......... | 703/14 |
| 2005/0149898 | A1 * | 7/2005 | Hakewill et al. ........... | 716/18 |
| 2007/0074137 | A1 * | 3/2007 | Nishida et al. ............ | 716/5 |
| 2007/0150249 | A1 * | 6/2007 | Asamoto ................ | 703/14 |
| 2008/0059925 | A1 * | 3/2008 | Seigler et al. ............. | 716/5 |
| 2008/0126063 | A1 * | 5/2008 | Beer et al. ............... | 703/14 |
| 2010/0299647 | A1 * | 11/2010 | Hakewill et al. ........... | 716/111 |

* cited by examiner

*Primary Examiner* — Phallaka Kik
(74) *Attorney, Agent, or Firm* — Sprinkle IP Law Group

(57) ABSTRACT

Embodiments of the methods and systems of the present invention may provide improved methods for the verification of an integrated circuit where a verification project for an integrated circuit may be created by selecting a set of intent units corresponding to the integrated circuit design from a library of intent units and linking these intent units to the integrated circuit design. Specifically, in one embodiment each of these intent units may comprise a corresponding code component and text component such that from the set of intent units selected and configured based on the integrated circuit design a verification plan can be generated from the text components of the corresponding intent units while a testbench can be generated from the code components of the corresponding intent units. This testbench can then be used to generate a model for testing the integrated circuit design.

27 Claims, 8 Drawing Sheets

SYSTEM AND METHOD FOR VERIFICATION OF INTEGRATED CIRCUIT DESIGN

RELATED INFORMATION

This application claims a benefit of priority to the filing date of U.S. Provisional Patent Application Ser. No. 60/900,826 by inventors William Canfield and Khalil Shalish, entitled "SYSTEM AND METHOD FOR CREATING AND IMPLEMENTING A TEST PLAN" filed on Feb. 12, 2007, the entire contents of which are hereby expressly incorporated by reference for all purposes.

TECHNICAL FIELD

Systems and methods disclosed herein relate generally to integrated circuit design. More specifically, embodiments of the systems and methods disclosed relate to the verification of the design of integrated circuit devices.

BACKGROUND

Integrated circuits are increasingly ubiquitous and are used in any number of products. These integrated circuits are being applied to perform an increasing numbers of tasks and as a consequence these integrated circuits are also becoming increasingly diverse and complex. With this increase in complexity comes a commensurate increase in the cost of building these integrated circuits.

As the cost of producing, masking and fabricating these integrated circuit becomes increasingly expensive, when designing microchips or other integrated circuits it is desired to ensure that the resulting design is free of bugs. Verification assures that an integrated circuit is designed as specified and the design functions as intended before the design is committed to fabrication. Consequently, as the functionality of the integrated circuits increases, a large part of the development cycle of a chip may comprise verification to ensure that no bugs exist in the design of the integrated circuit before the design is proved to manufacturing.

By the same token, however, the decreased lifecycle and product life of integrated circuits is driving a desire for a quick turnaround between the conception, design and production of an integrated circuit. Consequently, a tension exists between the desire to adequately test an integrated circuit design (which may be modeled in software such as Verilog, VHDL, RTL, another type of hardware description language (HDL) or the like) before the design is provided to manufacturing and the desire for reducing the time between design and production of integrated circuits.

What is desired, then, are systems and methods for the efficient verification of integrated circuits.

SUMMARY

Systems and methods which may be used for the verification of integrated circuits are disclosed herein. Specifically, embodiments of the methods and systems of the present invention may provide improved methods for the verification of an integrated circuit where a verification project for an integrated circuit may be created by selecting a set of intent units corresponding to the integrated circuit design from a library of intent units and linking these intent units to the integrated circuit design. Each of these intent units may comprise a corresponding code component and text component such that from the set of intent units selected and configured based on the integrated circuit design a verification plan can be generated from the text components of the corresponding intent units while a testbench can be generated from the code components of the corresponding intent units. This testbench can then be used in conjunction with the design component of the integrated circuit to generate a model for testing the integrated circuit design.

Each of the intent units may itself comprise information for testing a specific design element in an integrated circuit. By providing a library of these intent units for a verification engineer to select from when creating a verification project a number of advantages may be achieved. To begin with the library of intent units may be reusable such that the same intent unit may be used to test numerous similar elements of the same or different integrated circuit designs. Furthermore, new intent units may be created and added to the library relatively easily. To facilitate this process the intent units may provide a number of desirable properties, including inheritance, to allow new intent units to be defined based upon existing intent units. These derived units may inherit the code components and text component of their base intent unit, allowing the engineer developing the new intent unit to begin the development with the inherited code and text components. The intent units may also use templates which allow the code component or text component of the intent unit to be developed without consideration of the type of design element with which the intent unit is designed to be utilized. Thus, the library of intent units is not only reusable but easily extensible as well, providing a simple methodology for verification engineers to manage and implement the verification process.

By structuring the development of test plan documents in the manner of embodiments of the invention disclosed or other embodiments, a number of advantages may be achieved by the systems and methods of the present invention by allowing a connected flow from a verification plan to a verification implementation. One of these advantages is that source code for the verification of an integrated circuit design may be automatically generated from a test plan document with little to no manual coding by a programmer. This code may be a low level verification language and may actually be used to test the design of the integrated circuit (e.g. using the software representation of the integrated circuit). This automatic code generation aspect reduces the need for test engineers to know what may be a relatively complicated low level verification language.

Another advantage is intent units can be extended (e.g. manually transformed or altered), customized, composited (e.g. coupling one or more intent units together to create another intent unit), custom intent units created, etc. according to particular testing desires. Additionally, if no intent unit currently exists to test a specific functionality or element of an integrated circuit a place holder or assumption for such an intent unit may be utilized for the test plan document and the features for that intent unit developed at a later time and stored in the library.

By utilizing intent units and associated features in a library reusability of the intent units (e.g. features, text or code associated with the intent unit) may be reused in multiple testing contexts (e.g. for the verification of multiple integrated circuit designs) and thus may alleviate the need to develop text or code for the testing of each individual integrated circuits. The use of intent units may also allow the compositing of complicated verification plans for different levels of a system (e.g. system level verification plan, board level, integrated circuit level, etc.) by merging previously created test documents.

These intent units may also provide a way to allow the timing of an integrated circuit design to be tested or the timing of the tests to be specified by incorporating timing through system verilog properties and sequences. These properties and sequences may be used to describe timing (e.g. using code) needed for the proper testing of an integrated circuit. However, in the past these properties and sequences were hard coded. Thus there was no way to override these properties and sequences. Embodiments of the present invention may provide empty properties and sequences and the ability to override properties and sequences for a particular intent unit. More specifically, in certain embodiments an intent unit may have abstract interfaces where the interfaces can have a set of properties, sequences and functions which may be configured based on the timing needed for a particular integrated circuit design.

Embodiments of the present invention can be implemented in a computer communicatively coupled to a network (e.g., the Internet), another computer, or in a standalone computer. As is known to those skilled in the art, the computer can include a central processing unit ("CPU"), at least one read-only memory ("ROM"), at least one random access memory ("RAM"), at least one hard drive ("HD"), and one or more input/output ("I/O") device(s). The I/O devices can include a keyboard, monitor, printer, electronic pointing device (e.g., mouse, trackball, stylus, etc.), or the like. In embodiments of the invention, the computer has access to at least one database over the network.

ROM, RAM, and HD are computer memories for storing computer-executable instructions executable by the CPU. Within this disclosure, the term "computer readable medium" is not limited to ROM, RAM, and HD and can include any type of data storage medium that can be read by a processor. For example, a computer-readable medium may refer to a data cartridge, a data backup magnetic tape, a floppy diskette, a flash memory drive, an optical data storage drive, a CD-ROM, ROM, RAM, HD, or the like.

The processes described herein may be implemented in suitable computer-executable instructions that may reside on a computer readable medium, for example computer memory such as a hard disk, cache, RAM, etc. Alternatively, the computer-executable instructions may be stored as software code components on a DASD array, magnetic tape, floppy diskette, optical storage device, or other appropriate computer readable medium or storage device.

In one embodiment of the invention, the computer-executable instructions may be lines of complied C++, Java, HTML, or any other programming or scripting code. Other software/hardware/network architectures may be used. For example, the functions of the present invention may be implemented on one computer or shared among two or more computers. Thus, the functions of the present invention may be distributed in the network. Communications between computers implementing embodiments of the invention can be accomplished using any electronic, optical, ratio frequency signals, or other suitable methods and tools of communication in compliance with known network protocols.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DETAILED DESCRIPTION

Figure 1:
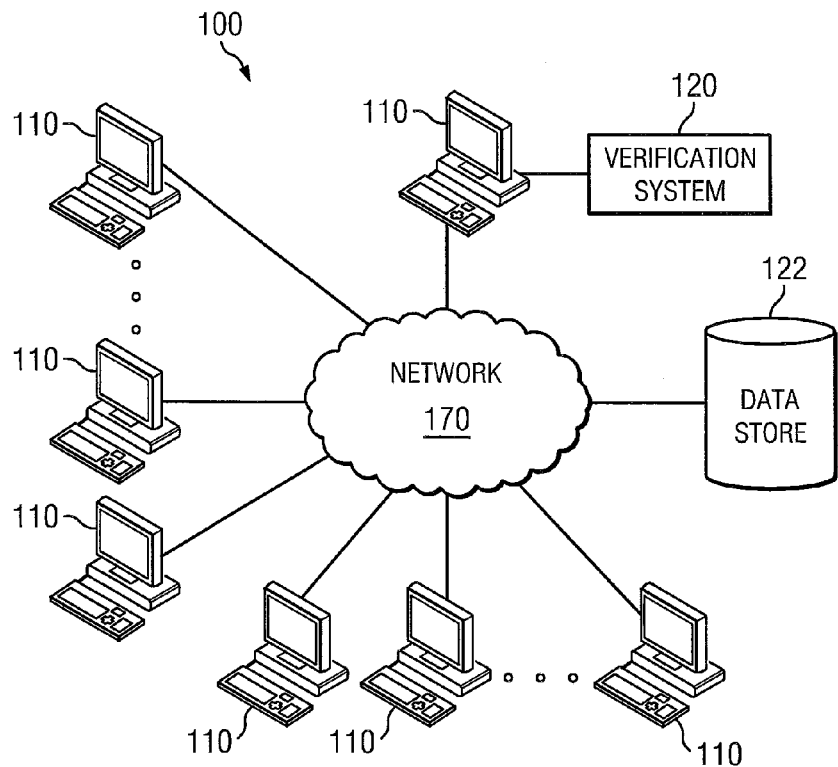
FIG. 1 is a diagram of one embodiment of a computer system including a verification system.

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited only those elements but may include other elements not expressly listed or inherent to such process, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, any examples or illustrations given herein are not to be regarded in any way as restrictions on, limits to, or express definitions of, any term or terms with which they are utilized. Instead these examples or illustrations are to be regarded as being described with respect to one particular embodiment and as illustrative only. Those of ordinary skill in the art will appreciate that any term or terms with which these examples or illustrations are utilized will encompass other embodiments, implementations and adaptations thereof, which may or may not be given therewith or elsewhere in the specification and all such embodiments, implementations and adaptations are intended to be included within the scope of that term or terms. Language designating such nonlimiting examples and illustrations includes, but is not limited to: "for example", "for instance", "e.g.", "in one embodiment", etc.

Now, returning to the discussion at hand, modern integrated circuits (also referred to as semiconductor devices or chips) are often designed according to or in accordance with a specification. A specification is usually a human-readable document which details desired functionality, components, signals, interoperability, or any other information pertinent to the integrated circuit. These specifications may be a collaborative effort by one or more organizations and may be revised and reviewed any number of times during the development cycle of the integrated circuit. This specification may then be used as a basis with which to draft or produce a design for the integrated circuit which meets the specification. This design may be modeled in a design language such as Verilog, VHDL or another hardware design language (HDL). A representation of the integrated circuit, such as those in a hardware design language or another type of representation, may be referred to as the design component.

As mentioned above, because of the complexity of modern integrated circuits and the resultant complexity of the specification and the design, it is generally necessary to verify the design in order to ensure that the design of the integrated circuit meets the specification and to ensure that no bugs or other problems exist within the design. This may a long and involved process, as during the development cycle of an integrated circuit the specification and design of the integrated circuit may be altered many times.

Thus, one way of reducing the time period involved in the production of an integrated circuit is to reduce the time associated with, or otherwise improve, the verification process associated with the development cycle of an integrated circuit. More specifically, the verification process may comprise the creation of a verification plan comprising a description (in text or otherwise) of the functionality of the integrated circuit design which it is desired to test and a testbench to actually test the integrated circuit. This testbench may be code written, for example in an HVL (Hardware Verification Language) such as Vera, E or SystemVerilog which is used to create stimulus in order to check and generate output based on the behavior of the design. The functionality of the testbench will, in most cases, be in accordance with the verification plan. A verification model of the integrated circuit in operation may then be created from the testbench and the design component corresponding to the integrated circuit in order to verify the design.

Typically, this type of verification comprises talking to the integrated circuit architect to determine the functionality of the integrated circuit and how to test the integrated circuit. From this information a verification plan can be developed and reviewed by the engineers developing the integrated circuit or test engineers. The integrated circuit is then designed and the design component created. To test the design of the integrated circuit then, a testbench is manually developed from the verification plan. In other words a set of programmers manually create a set of tests based upon the verification plan describing the functionality of the integrated circuit to be tested.

This type of verification process presents a number of problems. First and foremost is that the verification plan, which may have been created at the beginning of the development process, grows stale during the actual design and implementation of the integrated circuit. Thus, the testbench created from this verification plan at a later point in the design process may not test all the functionality of the integrated circuit design or may not be operable to test the current functionality of the integrated circuit design at all, as many changes to the architecture or functionality of an integrated circuit may occur during the design of the integrated circuit. Thus, bugs may exist in the integrated circuit design which are not detected, and these bugs may actually make it into the manufactured integrated circuit.

Furthermore, the creation of the testbench may entail a great deal of specialized knowledge. The creation of the testbench may entail knowledge of object oriented programming methods, SystemVerilog or other very complicated programming languages, etc. This knowledge is usually not within the ken of typical verification or test engineers. In addition, any code developed by these test engineers may not be reusable as each engineer may code his own verification testbench in a vacuum according to specific design elements of that integrated circuit. Consequently, a testbench designed for register level tests may not be reusable for, memory, chip, board or system level test or the like, or may not be reusable for verification tests applicable to other integrated circuits with similar functionality.

As a result of these problems it is desired to develop methods and systems for verification of integrated circuits which allow verification plans and testbenches to evolve organically through the development cycle in conjunction with the design of the integrated circuit such that both a testbench and a verification plan synchronized to the current design of the integrated circuit may be generated at almost any point during the development cycle of the integrated circuit.

To that end, attention is now directed to embodiments of the systems and methods of the present invention. Specifically, embodiments of the methods and systems of the present invention may provide improved methods for the verification of an integrated circuit where a verification project for an integrated circuit may be created by selecting a set of intent units corresponding to the integrated circuit design from a library of intent units and linking these intent units to the integrated circuit design. Each of these intent units may comprise a corresponding code component and text component such that from the set of intent units selected and configured based on the integrated circuit design a verification plan can be generated from the text components of the corresponding intent units while a testbench can be generated from the code components of the corresponding intent units. This testbench can then be used in conjunction with the design component of the integrated circuit to generate a model for testing the integrated circuit design.

Each of the intent units may itself comprise information for testing a specific design element in an integrated circuit. An intent unit may for example, comprise verification code written in an HVL (such as Vera, SystemVerilog, e, or the like) or a HDL (Verilog, VHDL, or the like), together with a text component which describes the design features of the specific design element tested by the code. The code portion of the intent unit may be a module, entity, interface, etc. which can be instantiated into a design or testbench. The text part of the intent unit can be viewed as items within a verification plan document which may be produced using the text component.

By providing a library of these intent units for a verification engineer to select from when creating a verification project a number of advantages may be achieved. To begin with the library of intent units may be reusable such that the same intent unit may be used to test numerous similar elements of the same or different integrated circuit designs. Furthermore, new intent units may be created and added to the library relatively easily. To facilitate this process the intent units may provide a number of desirable properties, including inheritance, to allow new intent units to be defined based upon existing intent units. These derived units may inherit the code components and text component of their base intent unit, allowing the engineer developing the new intent unit to begin the development with the inherited code and text components. The intent units may also use templates, which allows the code component or text component of the intent unit to be developed without consideration of the type of design element with which the intent unit is designed to be utilized. Thus, the library of intent units is not only reusable but easily extensible as well, providing a simple methodology for verification engineers to manage and implement the verification process.

Furthermore, as the intent units selected may be linked to the integrated circuit design a synchronization between the design of the integrated circuit, the verification plan and the testbench may be created such that changes within one of these elements may be propagated to, or otherwise accounted for (manually or automatically) in one or more of the other elements. For example, a change in the design of the integrated circuit may be accounted for in the intent unit, synchronizing any subsequently generated verification plan or testbench to this design change. Similarly, embodiments of the present invention allow parallel development of the verification plan and testbench, as both are generated using the set of linked intent units. Not only does this parallel development increase efficiency in the verification process but additionally, it allows dynamic consistency between the verification plan and the testbench, at any point in the development cycle both a current testbench and a current verification plan reflecting that testbench may be generated.

Before delving into further details regarding embodiments of the present invention it may be helpful here to discuss an example of a computing system which may be useful in implementing or describing these, or other, embodiments. FIG. 1 depicts one embodiment of such a computing system 100. Computing devices 110, such as personal computers, workstations, etc. may be coupled to one another and a data store 122 (which may for example be any type of computer readable media) via a communications network 170 which may be a LAN, WAN, the Internet or another type of communications network altogether.

Users at computing devices 100, such as integrated circuit designers, may use one or more design applications (not shown) to create a design component for an integrated circuit from a design specification and save this design component in data store 122. Before, simultaneously with or after, the design component is created one or more verification engineers at a computing device 110 may use verification system 120 (which, in one embodiment may be a set of executable instructions on a computer readable media residing at one or more of the computing devices or another computing device altogether) to create a verification project corresponding to the design component for the integrated circuit.

Using this verification project, at any point a verification engineer at computing device 110 may create a verification plan or testbench corresponding to the design component using verification system 120, where the verification plan and testbench are synchronized with the current state of the design component. Additionally, using the created testbench, a model for the integrated circuit may be created and executed to test the integrated circuit's design.

Figure 2:
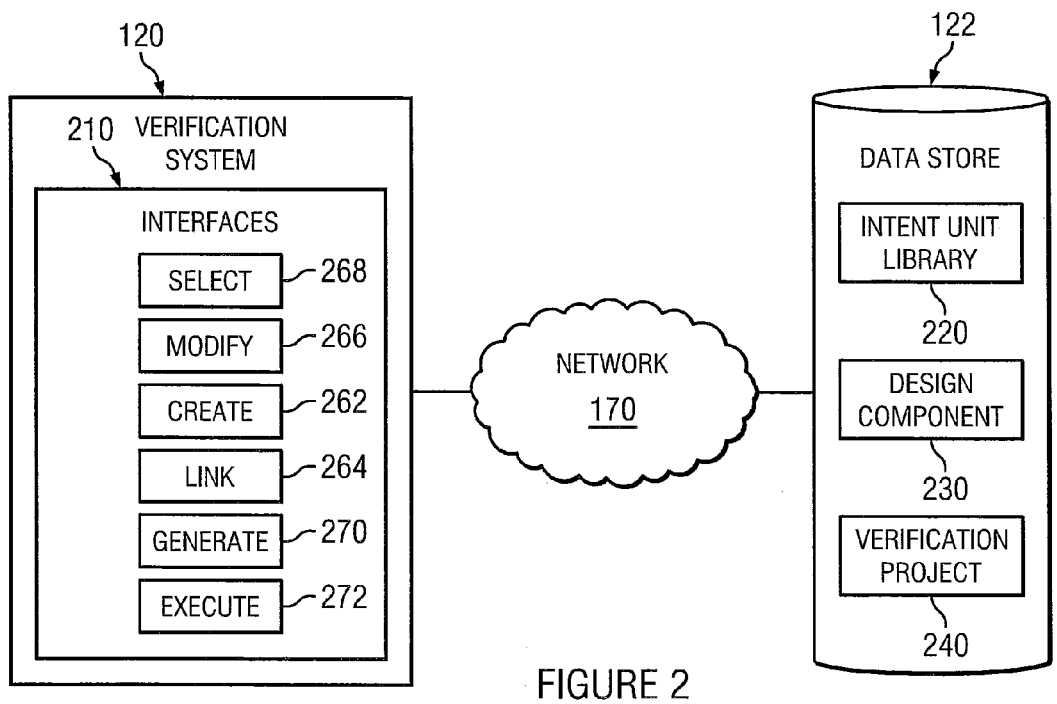
FIG. 2 is a diagram of one embodiment of a verification system.

Moving now to FIG. 2, a more detailed depiction of one embodiment of a verification system and a corresponding data store is depicted. For clarity, the one or more computing device 110 are not shown, but are connected to the verification system 120 as previously described in conjunction with FIG. 1. Data store 122 may comprise a library of intent units 220, one or more design components 230 and one or more verification projects 240. Each of the intent units in the library 220 of intent units may correspond to a design element and comprise a template including a text component and a code component. Each of the verification projects 240 comprises a set of intent units from library 220 (in one embodiment, copies of or references to, these intent units). Design components 230 are designs of integrated circuit devices in an HDL which may have been developed by design engineers at computing devices 110 and stored as one or more files in data store 122 or are currently undergoing development, have been copied from, or reference, another data store, are stored in different or distributed data stores, etc.

Each of verification projects 240 may be associated with a particular design component. In one embodiment, each of the set of intent units associated with a verification project may be linked to the associated design component such that a verification plan or testbench corresponding to that design component may be generated from the verification plan.

Verification system 120 may present an interface 210 which allows the creation of these verification projects, the selecting and linking of intent units, the creation or modification of intent units, the generation of verification plans and testbenches from verification plans or a whole host of other operations. These interfaces may, for example, include a graphical user interface (GUI), a command line interface, or one or more web pages which may be accessed through a web browser. These web pages may for example be in HTML or XHTML format, and may provide navigation to other web pages via hypertext links. These web pages may be retrieved by a user (using Hypertext Transfer Protocol (HTTP) or the like) from a local computer or from a remote web server where the server may restrict access only to a private network (e.g. a corporate intranet) or it may publish pages on the World Wide Web. Embodiments of interfaces such as these will be discussed in more detail subsequently.

In one embodiment, these interfaces 210 may provide a user such as verification engineer the ability to access or utilize the functionality of create function 262, link function 264, modify function 266, select function 268, generate function 270 and execute function 272. Create function 262 may allow a user to create a new verification project or an intent unit to be added to intent unit library 220. Modify function 266 may allow a user to modify an existing intent unit in intent unit library 220. Select function 268 may allow a user to select intent units from intent unit library 220 and associate a selected intent unit with a verification project 240. Link function 264 may allow a user to link one or more selected intent units with a design component 230. Generate function 270 may allow a verification plan, testbench or model to be created from a verification project and execute function 272 may allow such a model to be executed and the results observed.

It will be apparent after reviewing the above that verification system 120 may be a single or multiple applications, may comprise more or fewer interfaces or functions and the above illustration is one embodiment only, other implementations and embodiments will be possible and that all such other embodiments and implementations are contemplated by the scope of this application. As can be seen then, verification system 120 may be used to create a verification project and this verification project used to generate a verification plan and associated testbench for testing of an integrated circuit design.

Figure 3:
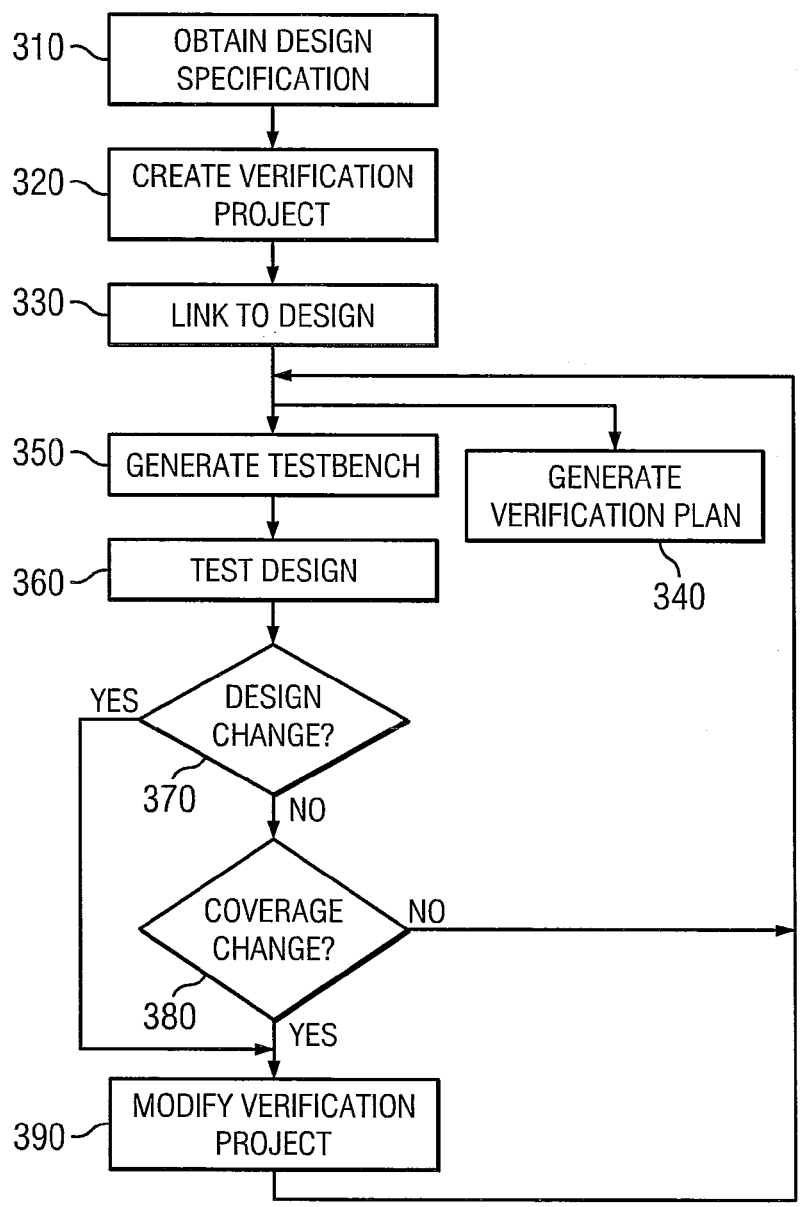
FIG. 3 is a flow diagram of one embodiment of a method for generating and using a verification project.

An embodiment of one such methodology for generating a verification project is illustrated in more detail in the flow diagram of FIG. 3. Initially, at step 310, a design specification may be obtained by, for example a verification engineer. This design specification may be a system architecture specification, a micro architecture specification or another document or description altogether, which describes or specifies in some manner the design, requirements, properties, functionality, etc. of an integrated circuit or a system with which the integrated circuit is designed to function.

A user may review the design specification and, based upon this document create a verification project at step 320 using verification system 120. More specifically, the user may select one or more intent units from intent unit library 220, where the selected intent units correspond to design elements of the integrated circuit which the user desires to test. The verification project may then be linked to the design of the integrated circuit using verification system 120 by linking the selected intent units.

The linking of an intent unit to the integrated circuit design may comprise attaching the intent unit to a particular design element of the integrated circuit. In one embodiment, the design element is a hierarchical element represented by code in the design component corresponding to the integrated circuit. An intent unit may be associated with a design element by associating it with the code of the design component which implements that design element vis-á-vis the design component. Linking an intent unit may also comprise configuring the intent unit specifically to the design element to which it is attached, as will be explained in more detail later.

The linking of intent units to particular design elements of the integrated circuit design may serve to propagate changes between the design component and any testbench or verification plan generated from a verification project associated with the design component. In one embodiment, verification system 120 may automatically propagate changes between and amongst component. For purposes of the description of this particular embodiment the term hard link will be used when a change in one component is detected and propagated to another component by the verification system.

In one embodiment, then a hard link between the set of intent units and the verification plan is created. If a text component of an intent unit changes any subsequently generated verification plan may also change. A hard link between the code components of the verification project and the testbench may be created. If a code component of an intent unit changes any subsequently generated testbench may also change. A hard link may exist between the design component and the code components of each linked intent unit. As a code component attaches to a specific design element if a change in the design element modifies the design hierarchy, parameter, or signals, the code component may not be properly linked. Therefore the code components and the design component should be synchronized.

Once the intent units of a verification project are linked to design elements of the design component at any point a verification plan may be generated at step 340 or a testbench for the integrated circuit design may be generated at step 350. The verification plan is comprised of the text components of the intent units selected and linked to the design component of the integrated circuit (steps 320, 330) and describes the test and verification processes implemented by the testbench. In one embodiment, this verification plan may be generated by applying a transformation process, including formatting, to the ordered text components of the linked intent units.

The testbench may be generated at step 350 from the code components of the linked intent units and may comprise executable code blocks designed to test elements of the integrated circuit design and corresponding data on where to instantiate the code block in association with the design component corresponding to the integrated circuit. This testbench may then be used in conjunction with the design component to test the design of the integrated circuit at step 360.

If after the integrated circuit design is tested it is desired to change the design (for example, because bugs, inefficiencies, or other problems are detected during the test) at step 370 the design of the integrated circuit may be altered. At step 390, then any desired modifications to the verification project in conjunction with the design alteration may be made. In many cases, as the intent units of the verification project are linked to the design component, the only modifications to a verification project will be the addition or subtraction of intent units from the set of intent units comprising the verification project based upon corresponding addition or subtraction of elements from the design of the integrated circuit.

Similarly, if the testbench is insufficient to test the integrated circuit design (for example it is determined that the testbench provides insufficient stimulus to test the integrated circuit design) at step 380, the verification project may be modified at step 390 to provide desired stimulus and a new verification plan and testbench generated at step 390. At any point, then during the development cycle of the integrated circuit a verification plan and testbench synchronized to the current state of the design of the integrated circuit may easily be generated from the verification project.

Figure 4:
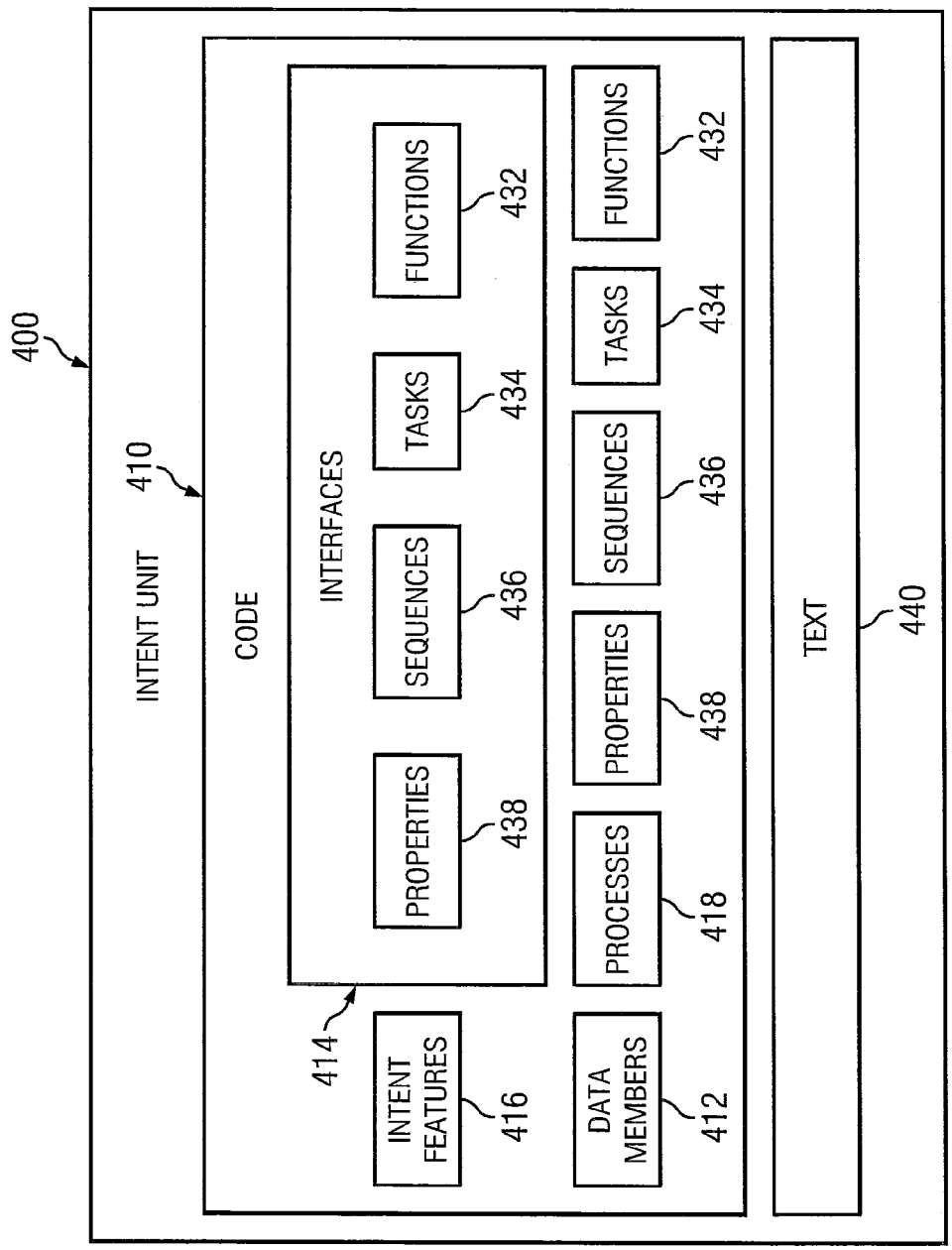
FIG. 4 is a diagram of one embodiment of an intent unit.

To explain certain embodiments in more detail it may first be useful to delve into more details of an intent unit. In order facilitate this process, FIG. 4 depicts one such embodiment of an intent unit. Intent unit 400 corresponds to a design element of an integrated circuit. This design element may be as simple or as complex as desired. For example, at the lowest level, intent unit 400 may represent basic elements of digital design such as registers FIFO queues, stacks, caches, etc. Higher level intent units may represent design elements such as a memory interface, bus interface (sometimes referred to as a bridge). Other design elements, including higher and lower level design elements may also be represented by intent unit 400.

In one embodiment, intent unit 400 is a template comprising code component 410 and text component 420. Code component 410 may be a container of hardware verification language (HVL) such as SystemVerilog which is designed to test the type of design element corresponding to intent unit 400. More specifically, in one embodiment the intent unit code component 410 comprises a set of data members 412 which can be of any built-in type of the HVL comprising the intent unit 410 or a user defined type. The intent unit code component 410 also comprises a set of interfaces 414 which may be a collection of ports (for example corresponding to the design element represented by intent unit 400) and a set of functions 432, tasks 434, sequences 436 or properties 438. These functions 432, tasks 434, sequences 436 or properties 438 may or may not be associated with a corresponding interface in the set of interfaces 414.

In one embodiment the set of functions 432 may be functions in the HVL comprising the code component 410 of the intent unit 400, the set of tasks 434 may be tasks in the HVL comprising the code component 410 of the intent unit 400, the set of sequences 436 may be sequences in the HVL comprising the code component 410 of the intent unit 400 and set of properties 438 may be a property in the HVL comprising the code component 410 of the intent unit 400. Any of these functions 432, tasks 434, sequences 436 or properties 438 may also be abstract, where no implementation is specified (and which may be added later by a user) or virtual where the behavior is determined by reference to another intent unit.

Code component 410 may also comprise processes 418 and intent features 416. Processes 418 may be one or more static process in the HVL comprising the code component 410 of the intent unit 400, for example in SystemVerilog such processes may comprise always processes, initial processes, assign processes, wire assignment processes, etc. Intent features 416 may each comprise code in the HVL comprising the code component 410 of the intent unit 400 where the intent feature represents a verification check, coverage, stimulus or assumption. An assumption feature may be a statement about a design feature that will be assumed to be true, for example a boundary constraint such as "this integer can only have values between 20 and 30". A checking feature is a statement regarding a design feature that a test should verify to be true. A coverage feature is a statement about which parts of the design to explore.

In one embodiment, coverage features are implemented as for example, SystemVerilog cover properties or cover groups. Coverage points may be very specific while whereas coverage groups may be relatively more general. Coverage features may correspond to a metric defining how well the design of the element corresponding to the intent unit 400 has been verified and thus may provide an indication of the degree to which verification has been completed. A stimulus feature is a statement about the scenario implemented by a particular test.

Text component 440 of intent unit 400 is a textual template comprising a description of the tests to be performed on the design element corresponding to intent unit 400 or the features of the code component 410. The text component 440 may comprise human language text, markup language text, such as HTML, XML, JavaDoc, etc., some combination of text and markup languages, or some other language altogether. By transforming the text component 440 of intent unit 400 a portion of a verification plan corresponding to the intent unit and its particular configuration may be obtained. In one embodiment, the text component 440 may utilize a markup language comprising a set of tags associated with code component 410 and a set of tags which determine the structure of text component 440 and any text in a verification plan resulting from the transformation of text component 440.

Text component 440 may, in one embodiment, be implemented using SystemVerilog (it will be noted that other HVL may similarly be utilized). Here the container for the text component 440 is a SystemVerilog comment. The basic set of display tags used in the body of the text are as follows:

@port(<port_name>): refers to ports of the Intent Unit. The output generated will depend on the state of the intent unit. If the is not attached, then the port name will be generated in the output text. If the intent unit is attached, then the signal expression connected to the port will be generated in the output text.

@param(<param_name>): refers to parameters of the Intent Unit. The output generated will depend on the state of the intent unit. If the intent unit is not attached, then the parameter name of the intent unit will be generated in the output text. If the intent unit is attached, then the parameter expression of attached intent unit will be evaluated and the result will be generated in the output text.

@unit(<unit_name>): refers to Intent Unit name. The output generated will depend on the state of the intent unit. If the intent unit is not attached, then the intent unit name of the intent unit will be generated in the output text. If the intent unit is attached, then the instance name of attached intent unit will be generated in the output text.

The basic set of control tags comprises:

@cond("<expression>"), @endcond: where these tags designate a section of the text as conditional on the expression <expression> evaluating to true. If the <expression> evaluates to true during the elaboration stage of the model, then the text is included in the output. Otherwise it may be omitted from the output.

The use of intent units 400 may present a number of advantages, including that intent units for specific design elements may be utilized to create new or modified intent units which correspond to design elements which may be different or more complex. These newly created intent units may then be added to the intent unit library 220 for future use in testing these types of design elements. Inheritance is one method for forming new or modified intent units using intent units that have already been defined. The intent unit which is being defined (known as a derived intent unit) may take over (or inherit) the code and text component of one or more previously defined intent units (which are referred to as base intent units) a user may then add or modify the inherited code or text components as desired to create the derived intent unit.

Specifically, in one embodiment, inheritance of an intent unit comprises inheritance of interfaces (referred to as derived interfaces) from the pre-existing interfaces of the base intent unit (referred to as base interfaces). In one embodiment, the new derived interface may have the following properties:

a. The derived interface contains all ports of the base interface where none of the base ports can be changed or removed in the derived interface. The derived interface can specify new ports in addition to the base ones.

b. The derived interface contains all the functions, task, sequences and properties of the base interface. These base functions, task, sequences and properties can be overridden in the derived interface. Furthermore, the derived interface can specify new functions task, sequences or properties in addition to the base ones.

Additionally in one embodiment, inheritance of intent features comprises the ability to disable or enable an intent feature declared in a base intent unit in the derived intent unit or the specification in the derived intent unit of an implementation for any abstract function, task, sequence or property in the base intent unit. To help further understanding of the implementation and use of intent units one example of an embodiment of an intent unit designed to represent the design element of a data bridge is discussed in Appendix A.

Now that one embodiment of intent units has been explained in more detail, it may be useful to discuss another embodiment of a method for generating and utilizing a verification project. A flow diagram for one embodiment of just such a method is illustrated in more detail in the flow diagram of FIG. 5A, which will be discussed in conjunction with the illustrative block diagram of FIG. 5B.

Initially, at step 510, a design specification may be obtained by, for example a verification engineer. This design specification may be a system architecture specification, a micro architecture specification or another document or description altogether, which describes or specifies in some manner the design, requirements, properties, functionality, etc. of an integrated circuit or a system with which the integrated circuit is designed to function.

A user may review the design specification and, based upon this document create a verification project determine a number of intent units at step 530 to associated with a verification project for an integrated circuit using verification system 120. More specifically, the user may select a number of intent units from intent unit library 220 or create one or more new or modified intent units (which may be added to intent unit library 220) where the selected intent units correspond to elements of the integrated circuit which the user desires to test.

Figure 5A:
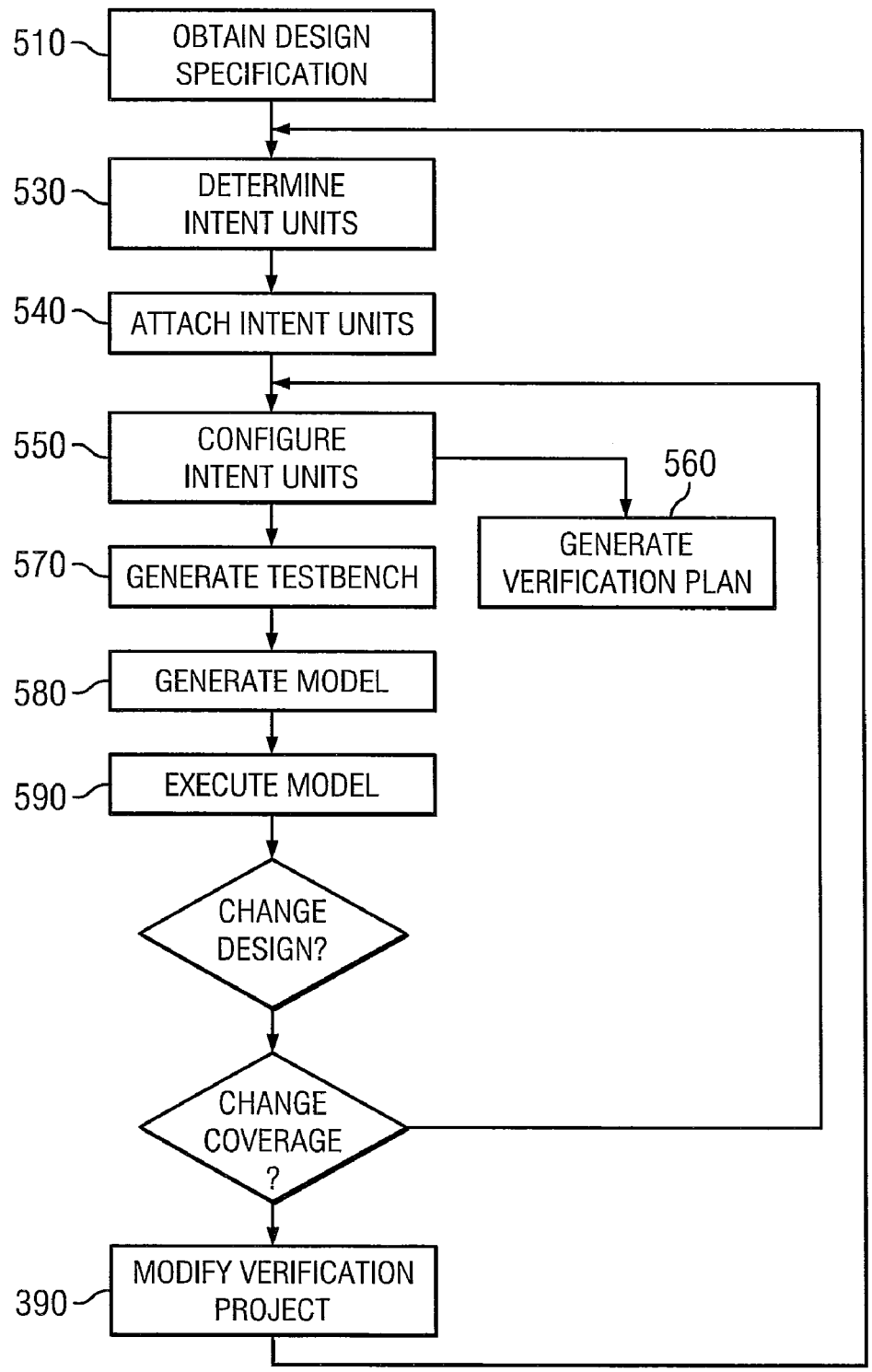
FIG. 5A is a flow diagram of one embodiment of a method for generating and using a verification project.
Figure 5B:
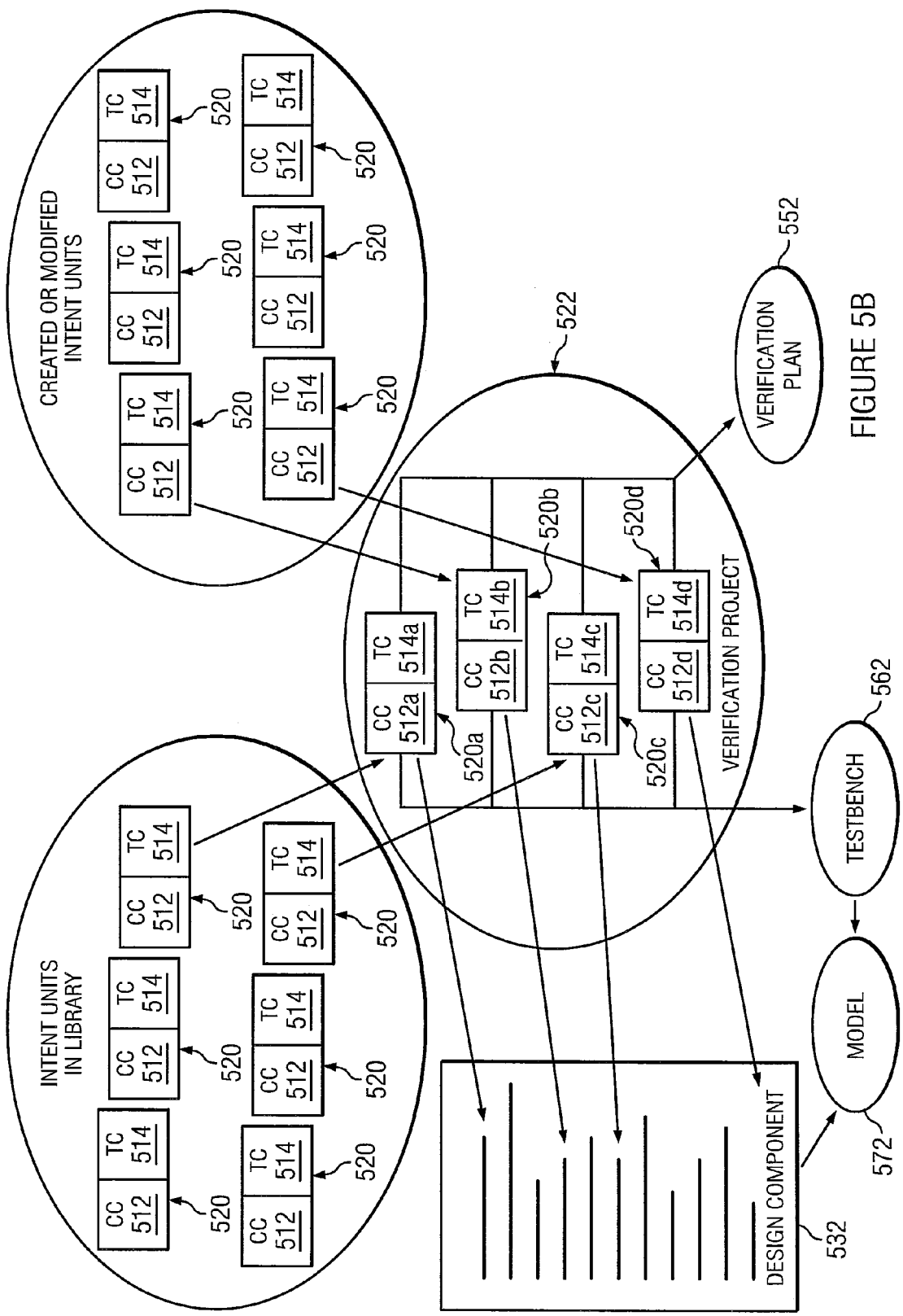
FIG. 5B is a diagram of one embodiment of generating and using a verification project.

With reference to FIG. 5B, to graphically illustrate: intent units 520 in library 220 may selected from the library 220 using, for example a graphical interface and added to verification project 522. Similarly, intent units 520 may be newly created or modified (a new intent unit created by modifying an existing intent unit in library 220) and one or more of these intent units added to verification project 522.

Returning to FIG. 5A, once the intent units for the verification project corresponding to a particular integrated circuit are determined at step 530. These intent units may then be attached at step 540 and configured at step 550. In one embodiment, the attachment of an intent unit to a particular design element links the intent unit to that design element and causes an instance of that intent unit to be instantiated and associated with the verification project. In many cases the design element to which an intent unit is linked is a design element of the type which the intent unit represents. This attachment process may be accomplished, in one embodiment, by specifying where in the code comprising the design component corresponding to the integrated circuit the intent unit will be attached. This specification may be done, for example using a graphical user interface which displays the code for the design component and allows a user to specify where in the displayed design code a particular intent unit is to be attached.

Configuration of an intent unit may associate specific information corresponding to the design of the integrated circuit with a particular intent unit to tailor the code and text component of the intent unit to the particular design element to which the intent unit is attached. Thus, a intent unit may be in one of three configuration states, a none or unconfigured state when an intent unit is selected but has not undergone any configuration, a partially configured state where some but not all of the items of the intent unit needing configuration have been configured and a fully configured states where all those items have been configured.

In particular, in one embodiment the interfaces or other aspects of the intent unit may be associated with aspects of the design of the integrated circuit, for example particular interfaces of the intent unit may be associated with signal lines of the integrated circuit design or other intent units.

Configuration of intent units may also comprise the enabling or disabling of text components by indicating which text components of the intent units are to be used to generate a verification plan and the ordering of the text components of the intent units which corresponds to the order in which any text generated based on the intent unit is to appear in the verification plan. Again, in one embodiment this configuration process may be accomplished by a user using a graphical user interface which allows aspects of the design to be associated with particular intent units, text components to be enabled, disabled or ordered. After or during the configuration process the verification system may check for missing or unimplemented sequences, properties, functions, tasks, etc. and inform the user of the missing or unimplemented items.

Now referring back to FIG. 5B, intent units 520a, 520b, 520c and 520d which have been selected for verification project 522 are attached to design component 532 and configured based on the design element to which they are attached, the design component 532 and other intent units 520.

Returning again to FIG. 5A, once the intent units of the verification project are configured they may be used to generate a verification plan at step 560. More specifically, in one embodiment to create a verification plan the text components of one or more of the intent units of the verification project are transformed to generate a viewable verification plan. In one embodiment, each of the text components of the intent unit which is enabled (as discussed earlier) may be ordered according to any order indicated or imposed by a user or an order may be arbitrarily decided or imposed based upon almost any number of criteria, including the order of selection, attachment or configuration of the intent units. The enabled and ordered text components may then be transformed to produce a viewable verification plan, including the transformation of any display tags or control tags of the text components being transformed.

Display tags may be those tages which identify code or elements of the design of the integrated circuit may be transformed based on the attachment and configuration of the intent unit comprising that text component or elaborated values of the design component. For example, the tag "@port (<port_name>)" may refers to the port of intent unit configured in conjunction with <port_name>, thus the configured port will be substituted for <port_name> during the transformation of the text component. Thus, in one embodiment the output generated will depend on the state of the intent unit. If the intent unit is not attached, then the port name associated with that tag will not be generated in the output text. If the intent unit is attached, then the signal expression connected to the port will be generated in the output text.

Similar transformation processes occur with the tags @param(<param_name≦), @unit(<unit_name≦), etc. (discussed above). In other words, the output generated by these tags may depend on the state of the corresponding intent unit. This transformation process may also comprise the transformation of control tags (those tags which control the structure of the output generated by the text components). For example, the @cond("<expression>") and @endcond tags designate a section of the text as conditional on the expression <expression> evaluating to true. If the <expression> evaluates to true (in one embodiment during the elaboration stage of the model) then the text may be included in the output generated for the verification plan. Otherwise it may be omitted from the output. With reference to FIG. 5B, text components 514a, 514b, 514c, 514d of intent units 520a, 520b, 520c, 520d which have been selected for verification project 522 are transformed based upon their respective attachment and configuration to design component 532 to produce verification plan 552.

To illustrate in more detail it may be useful to provide one example of such a text component and its transformation. Thus, in one embodiment suppose a text component of an intent unit is:

This @unit(arbiter) checker ensures that the resource arbiter provides @port(gnts) to corresponding @port(reqs) according to the specified @param(arbitration_rule) rule within the time window bounded by @param (min_cks) and @param(max_ks) cycles.

```
module arbiter
   #(
   parameter int              min_cks           = 1,
   parameter int              max_cks           = 0,
   parameter ArbitrationRule arbitration_rule   =
   ARBITRATION_RULE_DEFAULT,
   )
   (
   input logic reqs,
   input logic gnts,
```

```
);
endmodule : arbiter
```

If the above module is instantiated as:
abiter#(.mincks(10), .max_cks(20), .arbitration_rule(priority_enc)) arb_inst (.regs(reqs_conn), .gnts(gnts_conn));

Based on the parameter values and ports connections, the text component will get transformed to the following (for example in a verification plan produced using this example text component):

This arbiter checker ensures that the resource arbiter provides gnts_conn to corresponding reqs_conn according to the specified priority_enc rule within the time window bounded by 10 and 20 cycles.

Now going back to FIG. 5A, the configured intent units of the verification project may also be used to generate a testbench at step 570. More specifically, in one embodiment to create a testbench the code components and text components of the intent units of the verification project are transformed to generate code to test the features corresponding to the code component. In particular, in one embodiment, the set of code components from the intent units of the verification are compiled along with the corresponding set of text components to generate commented code, with an executable code portion resulting from the compilation of the code component and the comments to the code resulting from the compilation of the text components. In other words, in one embodiment the compilation of a code component results in executable code while the compilation of the corresponding text component (the text component of the same intent unit) may yield comments to that executable code.

This transformation process may, in one embodiment, be accomplished by mapping each intent unit container onto a SystemVerilog interface construct. During this mapping inheritance of one or more other intent units is specified through SystemVerilog Attributes. Particularly, inheritance of intent units may be implemented by segmenting the code of the base intent unit and reassembling the segmented code as a derived intent unit based on the inheritance lineage. Inheritance of the interfaces is implemented by segmenting the interfaces of the base intent unit and reassembling the segmented interfaces as a derived interface based on the inheritance lineage of the intent unit and the interface. Additionally, abstract interfaces, functions, tasks, properties and sequences may be implemented by relaxing the SystemVerilog language grammar to allow specification of empty SystemVerilog functions, task, properties and sequences. Intent features of the intent unit are managed as SystemVerilog code groupings tagged with SystemVerilog Attributes. Templated intent items are de-templated. They are then uniquely defined based on the template parameters and configuration of the intent unit. The value of the template parameters is substituted in the code of the template. Testbench code can then be generated.

In another embodiment this transformation process my be accomplished using a modified SystemVerilog compiler. The SystemVerilog language syntax and semantics are extended to allow
a) new syntax constructs: intent unit and intent feature,
b) inheritance of intent units,
c) abstract interfaces, functions, tasks, sequences and properties, and
d) virtual functions, tasks, sequences and properties.

It will be apparent to one of ordinary skill in the art how to modify a SystemVerilog compiler to accomplish these goals and thus the modification process will not be discussed in more detail herein. A compiler tool can then parses the extended SystemVerilog of a code component and generates valid compiled code based on the semantics of the code which include the support for Intent Units. With reference to FIG. 5B, code components 512a, 512b, 512c, 512d of intent units 520a, 520b, 520c, 520d which have been selected for verification project 522 are transformed based upon their respective attachment and configuration to design component 532 to produce testbench 562.

Referring back to FIG. 5A, the generated testbench may then be used in conjunction with the design component to generate a model for the testing and verification of the integrated circuit design at step 580. As depicted in FIG. 5B testbench 562 is used with design component 532 to create model 572. If after the design of the integrated circuit is tested it is desired to change the design (for example, because bugs, inefficiencies, or other problems are detected during the test) the design may be altered. At step 590, then any desired modifications to the verification project in conjunction with the design alteration may be made. In many cases, as the intent units of the verification project are linked to the design component, the only modifications to a verification project will be the addition or subtraction of intent units from the set of intent units comprising the verification project based upon corresponding addition or subtraction of elements from the design of the integrated circuit.

Similarly, if the testbench is insufficient to test the semiconductor design (for example it is determined that the testbench provides insufficient stimulus to test the integrated circuit design), the verification project may be modified at step 590 to provide desired stimulus and a new verification plan and testbench generated. At any point, then during the development cycle of the integrated circuit a verification plan and testbench synchronized to the current state of the design of the integrated circuit may easily be generated from the verification project.

Now that one embodiment of a methodology for the creation and use of verification projects has been explained it may now be helpful to give examples of interfaces which may be utilized to create or use these verification projects. As discussed above, these interfaces may be presented to a user by verification system 120 such that a user may more easily utilize the functionality of the verification system 120.

Figure 6:
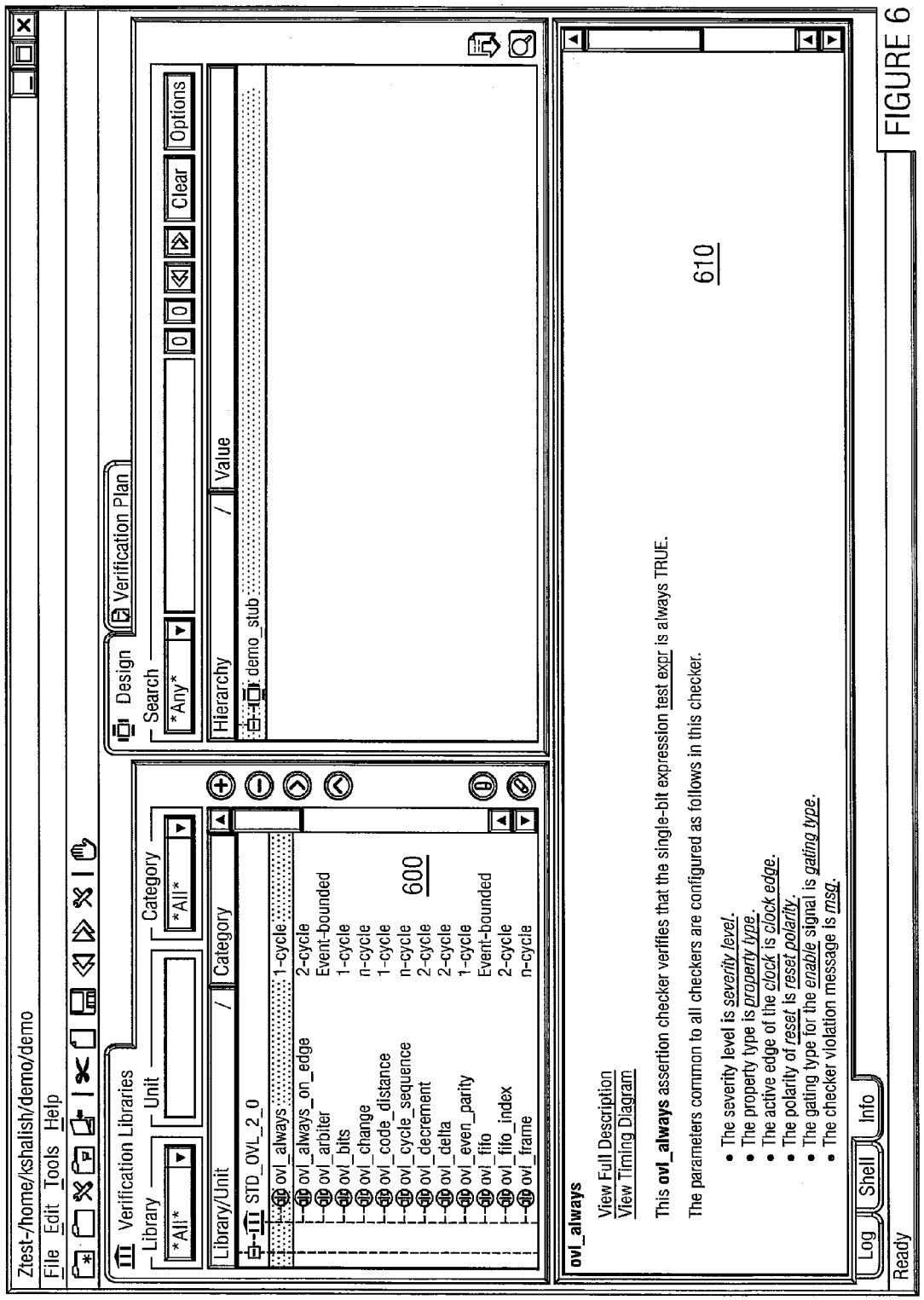
FIG. 6 is one embodiment of a graphical user interface for use with an embodiment of a verification system.
Figure 7:
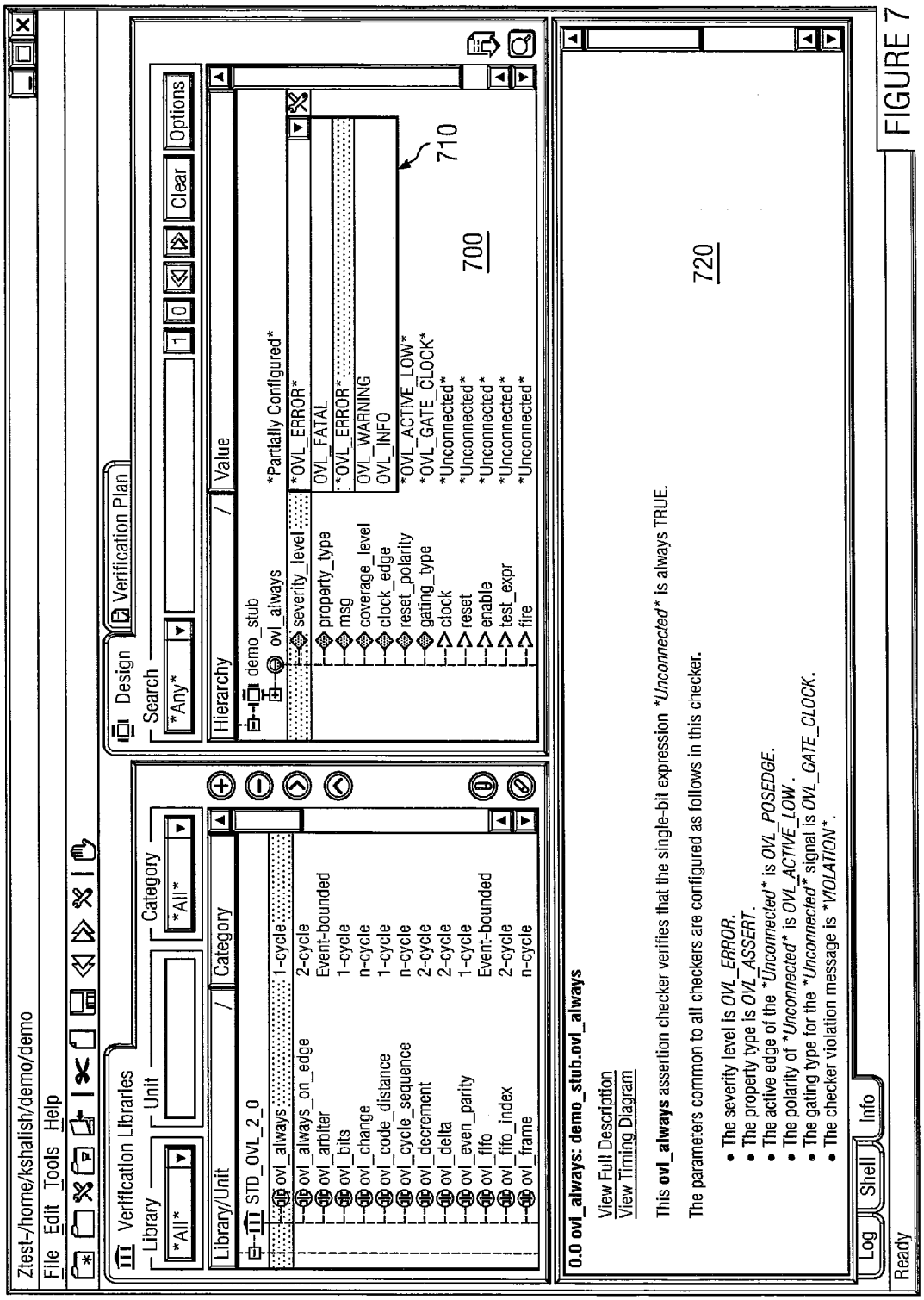
FIG. 7 is one embodiment of a graphical user interface for use with an embodiment of a verification system.
Figure 8:
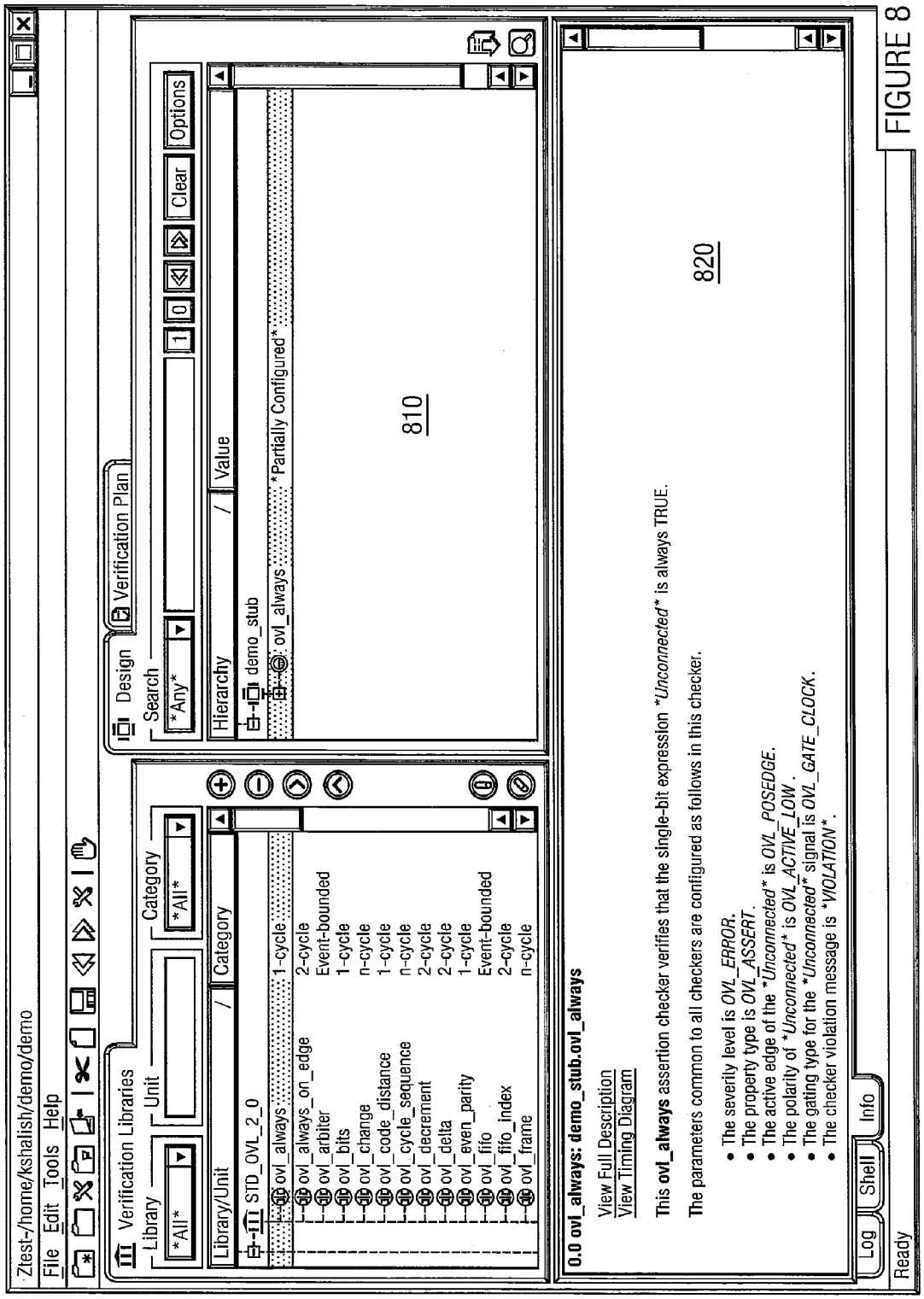
FIG. 8 is one embodiment of a graphical user interface for use with an embodiment of a verification system.

FIGS. 6-8 depict embodiments of such graphical user interfaces which may be presented to users of a verification system. More particularly, FIG. 6 depicts one embodiment of an interface for selecting an intent unit from a library of intent units. Notice here that the library of intent units is displayed in window 600 and that a description of a selected intent unit may be displayed in window 610. This description may be generated from the text component of the intent unit selected. As the intent unit selected may be in an unattached state at this point the description may display generic or default values.

FIG. 7 depicts one embodiment of an interface for configuring an intent unit. Notice here that the ports, features, etc. of intent unit to be configured are displayed in window 700 and that a drop down menu 710 may be presented in conjunction with these ports, features, etc. in order to select a value for their configuration. The selected (or previously configured value) for the port, feature, etc. may be displayed in conjunction with the description of the intent unit displayed in window 720.

FIG. 8 depicts one embodiment of an interface for selecting an intent unit. Notice here that the intent units already belonging to a verification project and an associated state are displayed in window 810 (in this case the verification project has been called "demo_stub" and the intent unit "ovl_always" has the state "Partially Configured"). By highlighting an intent unit in the verification project the description of the intent unit and associated configured values may be displayed in window 820.

In the foregoing specification, the invention has been described with reference to specific embodiments. However, one of ordinary skill in the art appreciates that various modifications and changes can be made without departing from the scope of the invention as set forth in the claims below and that various advantages which may or may not have been discussed may be obtained from these other embodiments. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

APPENDIX A

Here one embodiment of an intent unit operable to represent a data bridge, it will be apparent that the intent unit and surrounding descriptions are one embodiment only and should not be construed as limiting in any sense.

As discussed above, in one embodiment an intent unit is a construct, in effect a super module, which combines the features of the following language constructs:

SystemVerilog: modules, interfaces, classes, properties, sequences, program, covergroup C++: templates, inheritance Specifically, in one embodiment an intent unit can be viewed as a module which can contain the following items:
Data Members: built in and user defined data type. The user defined data types can be templated.
Interfaces: extended, templated and abstract (The abstract interface will be described later).
Functions: extended, templated
Tasks: extended, templated
Sequences: extended, templated
Properties: extended, templated
Processes: always, initial, assign and wire assignment.
IntentFeatures: check, cover and assumptions.
IntentUnits: extended, templated.

Furthermore, an intent unit can inherit or extend from other intent units. To illustrate the above embodiment of an intent unit, an intent unit for a data bridge intent unit will be depicted here in more detail. This intent unit may be referred to as a "DataBridge". The DataBridge will be built up in several steps moving from the more abstract to the more concrete implementation.

First, a small introduction to the DataBridge intent unit. The basic concept of a data bridge is: data on the North side of the bridge must match with data on the south side of the bridge.

The north side of the bridge is here assumed to be the "initiator" side. By "initiator" it is meant the north side of the bridge will be the one that initiates the bridging transfer of the data. Once the north side initiates the bridging transfer, data on either side must match. This is true whether the data is transferred from north-to-south or south-to-north. The timing of the data transfers on either side of the bridge is arbitrary with respect to each other but must occur after the transfer is initiated on the north side.

To implement an intent unit for this type of data bridge and make it reusable, the following pieces may be utilized:

Description of the north side and south side interfaces
These interfaces may be described using SystemVerilog interfaces and modules.
Indication of when the north side initiates a bridging transfer
The initiation action may be described as a SystemVerilog sequence or property. Sequences may be more reusable and flexible than properties.
Indication of when the data appears on each side of the bridge
The timing of the data on each side of the bridge may be described using a sequence.
Saving data for comparisons
Once data appears on each side the bridge, it must be saved for comparison. To accomplish this, a SystemVerilog function can be used to save the data for later comparison.
Data comparisons
Once data appears on both sides of the bridge, it should be compared to determine if it is identical. To accomplish this, a SystemVerilog function which compares the data on each side and returns true if it is identical may be used.
Error Reporting
If the data one either side does not match, an error should be reported. One way to report such an error is using a SystemVerilog assertion.

Given the above requirements, here is one embodiment of the code for DataBridge intent unit general code in zSV (ZocaloSystemVerilog) syntax. zSV is an extension to the SystemVerilog syntax.

Code Sample 1

```
(*zocalo intentunit*)interface DataBridge;
    (*zocalo_abstract*) interface nIntf; //North side interface
        (*zocalo_public*) sequence InitiateTransfer;
        (*zocalo_public*) sequence SampleNData;
    end interface
    (*zocalo_abstract*) interface sIntf; //South side interface
        (*zocalo_public*) sequence SampleSData;
    endinterface
    (*zocalo_public*) function bit StoreNData( );
    (*zocalo_public*) function bit StoreSData( );
    (*zocalo_public*) function bit DataIsMatched( );
    (*zocalo_intentfeature="check") property ValidDataBridge;
endinterface
```

It will be noticed that the above code is almost valid SystemVerilog code (SystemVerilog does not support empty declaration of properties and sequences and all property/sequence/task/function declarations must be terminated with endproperty/endsequence/endtask/endfunction keyword). The code introduces several zSV attributes (prefixed with zocalo_) which implements the intent unit specific concepts:

Abstract Interfaces
SystemVerilog has virtual interfaces. Abstract interfaces are different. The zocalo_abstract attribute is used to designate the SystemVerilog interface as an abstract interface. An abstract interface can be declared in an intent unit. An abstract interface in an intent unit states the following:
All ports to the interface can be specified through extension of the UI.

All sequences, properties, functions/tasks can be specified through an extension to the intent unit.

Given the concept of an Abstract Interface, the code above declares two abstract interfaces: nIntf (for the north side of the bridge) and sIntf (for the south side of the bridge).

The nIntf abstract interface contains two sequences:
  InitiateTransfer: Indicates the initiation of the transfer.
  SampleNData: Indicates when data is transferred on the north side.

The sIntf abstract interface constrains only one sequence:
  SampleSData: Indicates when data is transferred on the south side.

Thus, when the intent unit above is extended, the user may provide the following:
  All ports to the nIntf and sIntf.
  Implementation of all sequences: InitateTransfer, SampleSData, SampleSData Inheritance or Extension of Sequences, Properties, Functions and Tasks SystemVerilog does not allow a sequence or property to be to be overridden. This makes sequences and properties very rigid. This restriction for intent units may be eliminated through intent unit inheritance or extension. A sequence or a property declared in an intent unit or an abstract interface can be overridden and if it is empty, it can be specified. The same applies to functions and tasks declared in the intent unit. A function or task deleted in an intent unit can be overridden through intent unit inheritance. An empty function or task may generate a warning to a user at attachment or configuration time.

IntentUnit Features: Check, Assumption, Cover

This is used primarily for the convenience of mapping intent unit features into SystemVerilog constructs. The check feature maps onto an assertion. The cover feature maps onto a cover property or cover group depending on how it is specified. The assumption maps onto task containing a $info or $warning statement. The zSV attribute zocalo_intentfeature=check, cover or assumption is used designate a property or cover group as check or cover or assumption.

The above concepts provide a flexible mechanism for specifying interfaces and sequences but may do little for specifying generic types. In the case of the DataBridge, it is desired to be able to specify the granularity for data comparison. The granularity for comparison may be a bit, byte, word or a user defined type. In addition, the widths and/or types of the data on each side of the bridge may be different. To accomplish this, we take advantage of zSV type parameters.

The following zSV code adds type parameters and few more implementation details. The added items are indicated with //ADDED comments inside the code.

Code Sample 2

```
(*zocalo_intentunit*)
interface DataBridge; #( parameter type T=bit[7:0] )
  //ADDED: template type T//with default of bit[7:0]
  //ADDED: a helper wrapper class used for passing smart queues
  //as return values from functions
  (*zocalo_public*) classQueue #(parameter type QT=T);
    QT q[$];
  endclass
  (*zocalo_abstract*) interface nIntf; //North side interface
    (*zocalo_public*) sequence InitiateTransfer;
    (*zocalo_public*) sequence SampleNData;
    //ADDED: a function to return the north data in T chunks
    (*zocalo_public*) function Queue#(T) Ndata( );
```

Code Sample 2 -continued

```
  endinterface
  (*zocalo_abstract*) interface sIntf; //South side interface
    (*zocalo_public*) sequence SampleSData;
    //ADDED: a function to return the south data in T chunks
    (*zocalo_public*) function Queue#(T) Sdata( );
  endinterface
  (*zocalo_public*) function bit StoreNData( Queue#(T) data );
  (*zocalo_public*) function bit StoreSData( Queue#(T) data );
  (*zocalo_public*) function bit DataIsMatched(;
  (*zocalo_intentfeature="check"*) property ValidDataBridge;
  (*zocalo_protected*) T nFifo[$]; //ADDED:
  queue to store the north data
  (*zocalo_protected*) T sFifo[$]; //ADDED:
  queue to store the south data
endinterface
```

The next step to building a DataBridge intent unit is to add the final implementation details of the DataBridge intent unit's functions and features. The following is code for the DataBridge intent unit:

Code Sample 3

```
(*zocalo_intentunit*) interface DataBridge
  #( parameter type T=bit[7:0] )
;
  (*zocalo_public*) classQueue#(parameter type QT=T);
    QT q[$];
  endclass
  (*zocalo_abstract*) interface nIntf; //North side interface
    (*zocalo_public*) sequence InitiateTransfer;
    (*zocalo_public*) sequence SampleNData;
    (*zocalo_public*) function Queue#(T) NData( );
  endinterface
  (*zocalo_abstract*) interface sIntf; //South side interface
    (*zocalo_public*) sequence SampleSData;
    (*zocalo_public*) function Queue#(T) SData( );
  endinterface
  //ADDED: Implementation of StoreNData
  (*zocalo_abstract*) function bit StoreNData(
    Queue#(T) data );
    foreach( data.q[i] ) begin
      nFifo.push_back( data.da[i] );
    end
    return( 1 ); //Always return success=1
  endfunction
  //ADDED: Implementation of StoreSData
  (*zocalo_abstract*) function bit StoreSData(
    Queue#(T) data );
    foreach( data.q[i] ) begin
      sFifo.push_back( data );
    end
    return( 1 ); //Always return success=1
  endfunction
  //ADDED: Implementation of DataIsMatched
  (*zocalo_public*) function bit DataIsMatched( );
    bit isMatched=1;
    while( isMatched && nFifo.size( )>0 &&
    sFifo.size( )>0 ) begin
      isMatched &=
      (nFifo.pop_front( ) === sFifo.pop_front( ));
    end
    return( isMatched );
  endfunction
  //ADDED: Implementation of the ValidDataBrige check.
  (*zocalo_intentfeature="check"*)
    property ValidDataBridge;
    assert property(
      //Use north side clocking event
      @(nIntf.SampleNData.$clkevent)
      //Use matched method since the south side can be on
      //a different clock domain
      (nInft.SampleNData.ended ||
```

Code Sample 3 -continued

```
            sInft.SampleSData.matched)
                |-> (DataIsMatched( )
            );
    endintentfeature
    //ADDED: a public property ValidNData which stores the
    //north data into the north fifo.
    (*zocalo_public*) property ValidNData;
        @(posedge nIntf.SampleNDataClocking);
        (nIntf.SampleNData) |-> (StoreNData( nInft.NData( ));
    endproperty
    assert property( ValidNData );         //Property must be asserted
                                           //otherwise it is optimized away
    //ADDED: a public property ValidSData which stores the
    //south data into the south fifo.
    (*zocalo_public*) property ValidSData;
        @(posedge sIntf.SampleSData.Clocking);
        (nIntf.SampleSData) |-> (StoreSData( nInft.SData( ));
    endproperty
    assert property( ValidSData );         //Property must be asserted
                                           //otherwise it is
                                           optimized away.
    //Protected data
    (*zocalo_protected*) T nFifo[$];       //Queue to store
                                           the north data
    (*zocalo_protected*) T sFifo[$];       //Queue to store
                                           the south data
endintentunit
```

Note: This embodiment of the current implementation of the DataBridge intent unit is fairly simplistic. It assumes in-order data on both north and south sides of the bridge. For DataBridges which do not adhere to this assumption, the implementation of the DataBridge may be more complex. The abstract interfaces may be identical, however the implementation is more complex. Instead of fifos, associative arrays are used to store both data and tag (essentially address). The tag is needed to identify the "transfer". This more complex implementation is not covered herein but is covered by embodiments of the systems and methods of the present invention.

Now that the DataBridge code has been defined, if it is going to be of use, it may be desired to extend it. Through the extension of the DataBridge, the user can fully specify the abstract interfaces. Here is an example of an extension of the DataBridge.

Code Sample 4

```
(*zocalo_intentunit*) interface MyDatatBridge;
    (*zocalo_extend="DataBridge#(bit[7:0])"*)
    //Specify the North Interface
    (*zocalo_public*) interface nIntf( //Specify the ports
        input logic cpu_clk,
        input logic resetN,
        input logic trans,
        input logic ready,
        input logic[31:0] data,
        input logic[3:0] valid
        );
        //Transfer is initiated whenever trans==1 & ready==0
        (*zocalo_public*) sequence InitiateTransfer;
            @(posedge cpu_clk)
            (trans & !ready)
        ensdesquence
        //North data is valid whenever trans==1 ready==1 after
        //the transfer is initiated
        (*zocalo_public*) sequence SampleNData;
            @(posedge cpu_clk)
            InitiateTransfer ##1 (trans & ready)[->1];
        endsequence
```

Code Sample 4 -continued

```
        //Return north data in byte size chunks based
        on the valid bits.
        (*zocalo_public*) function Queue#(bit[7:0]) NData( );
            Queue#(bit[7:0]) temp;
            temp = new( );
            for( integer unsigned i=0; i<4; ++i ) begin
                if (valid[i]) begin
                    temp.q.push_back( data[(8*(i+1)-1)-:8] );
                end
            end
            return( temp );
        endfunction
    endinterface: nInftf
    //Specify the south side interface
    (*zocalo_public*) interface sIntf( //South side ports
        input logic mem_clk,
        input logic resetN,
        input logic chip_selectN,
        input logic wr_enableN,
        input logic[16:0] dout,
        input logic[1:0] mask
        input logic mem_width
        );
        //South data is sampled whenever the chip select goes low
        //and within 5 cycles lates the wr_enableN goes low
        (*zocalo_public*) sequence SampleSData;
            @(posedge mem_clk)
            ($fell(chip_selectN) && wr_enableN )
            ##1
            (!chip_selecN && wr_enableN)[*0:5]
            ##1
            $fell( wr_enableN) );
        endsequence
        //Return north data in byte size chunks.
        (*zocalo_public*) function Queue#(bit[7:0]) Sdata( );
            temp Queue#(bit[7:0]) temp;
            temp = new( );
            for( integer unsigned i=0;
            i <( 2'b1 << mem_width); ++i ) begin
                if (mask[i]) begin
                    temp.q.push_back( data[(8*(i+1)-1)-:8] );
                end
            end
            return( temp );
        endfunction
    endinterface: sIntf
endinterface: MyDataBridge
```

Once a DataBridge intent unit is attached and configured, it can be exported as valid SystemVerilog code. Essentially the following transformations occur during the SystemVerilog export:

The intent unit is exported as an interface.
    The abstract interfaces are pulled out the intent unit:
    The pulled abstract interfaces become input interfaces to the intent unit interface.
Clocking blocks are generated for pulled abstract interfaces. For each sequence/property in the abstract interface a corresponding clocking block will be generated.
Bind statements are generated for all of the pulled abstract interfaces.
A bind statement is generated for the intent unit module which attaches the module to the design.

Here is the SystemVerilog code corresponding to the above instantiation:

Code Sample 5

```
interface  nIntf(
    //North side ports
```

Code Sample 5

```
        input logic cpu_clk,
        input logic resetN,
        input logic trans,
        input logic ready,
        input logic[31:0] data,
        input logic[3:0] valid
    );
    //Transfer is initiated whenever trans==1 & ready==0
    sequence InitiateTransfer;
        @(posedge cpu_clk)
        (trans & !ready)
    ensdesquence
    //North data is valid whenever trans==1 ready==1 after
    //the transfer is initiated
    sequence SampleNData;
        @(posedge cpu_clk)
        InitiateTransfer ##1 (trans & ready)[->1];
    endsequence
    //Return north data in byte size chunks
    //based on the valid bits.
    function Queue(bit[7:0]) NData( );
        Queue#(bit[7:0]) temp;
        temp = new( );
        for( integer unsigned i=0; i<4; ++i ) begin
            if (valid[i]) begin
                temp.q.push_back( data[(8*(i+1)-1)-:8] );
            end
        end
        return( temp );
    endfunction
    clocking InitiateTransferClocking
        @(posedge cpu_clk);
    endclocking
    clocking SamplNData
        @(posedge cpu_clk);
    endclocking
endinterface: nIntf
interface sIntf;
    //Soutth Side ports
    input logic mem_clk,
    input logic resetN,
    input logic chip_selectN,
    input logic wr_enableN,
    input logic[16:0] dout,
    input logic[1:0] mask,
    input logic mem_width
    );
    //South data is sample whenever the chip select goes low
    // and within 5 cycles lates the wr_enableN goes low
    sequence SampleSData;
        @(posedge mem_clk)
        ($fell(chip_selectN) && wr_enableN )
        ##1
        (!chip_selecN && wr_enableN)[*0:5]
        ##1
        $fell( wr_enableN) );
    endsequence
    //Return north data in byte size chunks.
    function Queue#(bit[7:0]) sIntf_SData( );
        temp Queue#(bit[7:0]) temp;
        temp = new( );
        for( integer unsinged i=0;
        i <( 2'b1 << mem_width); ++i ) begin
            if (mask[i]) begin
                temp.q.push_back( dout[(8*(i+1)-1)-:8] );
            end
        end
        return( temp );
    endfunction
    clocking SampleSDataClocking
        @(posedge mem_clk);
    endclocking
endinterface: sIntf
interface MyDataBridge( i_nIntf nIntf, i_sIntf sIntf);
    //Implementation of StoreNData
    function bit StoreNData( Queue#(T) data );
        foreach( data.q[i] ) begin
            nFifo.push_back( data.da[i] );
        end
        return( 1 );    //Always return success=1
    endfunction
    //Implementation of StoreSData
    function bit StoreSData( Queue#(T) data );
        foreach( data.q[i] ) begin
            sFifo.push_back( data );
        end
        return( 1 ); //Always return success=1
    endfunction
    //Implementation of DataIsMatched
    function bit DataIsMatched( );
        bit isMatched=1;
        while( isMatched && nFifo.size( )>0 &&
            sFifo.size( )>0 ) begin
            isMatched &=
                (nFifo.pop_front( ) === sFifo.pop_front( ));
        end
        return( isMatched );
    endfunction
    //Implementation of the ValidDataBrige check.
    assert property(
        //Use north side clocking event
        @( nIntf.SampleNDataClocking )
        //Use matched method since the south side can be on
        //a different clock domain
        (nInft.SampleNData.ended || sInft.SampleSData.matched)
                |-> (DataIsMatched( )
    );
    //Public property ValidNData which stores the north data
    //into the north fifo.
    property ValidNData;
        @( nIntf.SampleNDataClocking);
        (nIntf.SampleNData) |-> (StoreNData( nInft.NData( ));
    endproperty
    assert property( ValidNData );    //Property must be asserted
                                      //otherwise it is
                                      //optimized away
    //ADDED: a public property ValidSData which stores the
    //south data into the south fifo.
    property ValidSData;
        @( sIntf.SampleSDataClocking );
        (sIntf.SampleSData) |-> (StoreSData( sInft.SData( ));
    endproperty
    assert property( ValidSData );    //Property must be asserted
                                      //otherwise it is
                                      //optimized away.
    //Protected data
    bit[7:0] nFifo[$];        //Queue to store the north data
    bit[7:0] sFifo[$];        //Queue to store the south data
endintentfeature: MyDataBridge
bind design I_nIntf #(bit[7:0]) nIntf (.*);
bind design I_sIntf #(bit[7:0]) sIntf (.*);
bind design MyDataBridge #(bit[7:0]) instMyDataBridg (.*);
```

Thus, to support intent units such as these a verification system may support the following features:
  Parse the IntentUnit zSV code.
    Ability to parse empty sequences/properties/functions/tasks.
    Recognition of Zocalo specific attributes.
  Analyze the IntentUnit zSV code.
  Once the intent unit is parsed, the verification system performs an analysis step to determine the following:
    Abstract Interfaces
    Public Properties/Sequences
  Configuration of intent unit
    Provide an interface for the user to specify connections to the interfaces and ports of the intent unit.
    Elaboration check to make sure the configuration of the intent unit is valid.
  SystemVerilog Export of configured intent unit
    Pull out abstract interfaces.

Generate clocking blocks for the abstract interfaces if needed.

Generate bindings for the intent unit and the abstract interfaces.

What is claimed is:

1. A method for verifying integrated circuit design, comprising:

defining a set of intent units, each intent unit comprising a code component, wherein the set of intent units comprises at least one base intent unit and at least one derived intent unit, the derived intent unit derived from the base intent unit and inheriting one or more interfaces or processes from the base intent unit, the derived intent unit referencing the base intent unit;

coupling multiple intent units together to form a composite intent unit;

providing a graphical user interface that allows users to associate intent units to specific design elements of an integrated circuit, wherein the specific design elements comprise constituent elements of the integrated circuit design;

linking the one or more intent units including the composite intent unit to a design element of the integrated circuit based on input in the graphical user interface wherein the design element of the integrated circuit corresponds to the design element corresponding to the intent unit;

generating, by a computer, a verification plan corresponding to the integrated circuit based upon each of the one or more intent units, wherein the verification plan describes a verification procedure for the integrated circuit and contains information from each intent unit linked to the design element in an integrated verification plan;

generating, by a computer, a testbench corresponding to the design of the integrated circuit based upon each of the one or more intent units, wherein generating a test bench comprises compiling the code components of the one or more intent units including code components of the intent units coupled together to form the composite intent unit; and generating, by a computer, a test model from the testbench and a design component corresponding to the integrated circuit.

2. The method of claim 1, wherein each of the intent units further a text component.

3. The method of claim 2, wherein the verification plan is generated based upon the text components of each of the one or more intent units.

4. The method of claim 3, wherein generating the verification plan comprises transforming each of the text components of the one or more intent units.

5. The method of claim 4, wherein generating the testbench comprises compiling the code components of each of the one or more intent units.

6. The method of claim 5, wherein the verification plan describes the testbench and the verification plan and testbench are synchronized to the design of the integrated circuit.

7. The method of claim 6, wherein attaching the intent units comprises associating each intent unit with code of a design component corresponding to the integrated circuit which represents the design element of the integrated circuit.

8. The method of claim 7, wherein generating a test model comprises compiling the test bench and the design component.

9. The method of claim 1, further comprising:

selecting the base intent unit;

deriving the derived intent unit from the first intent unit, wherein the derived intent unit inherits at least one interface from the base test unit.

10. The method of claim 9, wherein generating the test bench comprises mapping each of the one or more intent units onto a SystemVerilog interface, further comprising segmenting the code of the base intent unit and resembling the segmented code for mapping the derived intent unit based on an inheritance lineage.

11. The method of claim 9, wherein the base intent unit is not specific to a type of design element.

12. The method of claim 11, further comprising configuring the derived intent unit to be specific to a selected type of design element.

13. The method of claim 1, further comprising:

changing an intent unit of the one or more intent units linked to the design element; and automatically updating the verification plan and testbench based on the change to the intent unit.

14. The method of claim 1, further comprising:

linking at least one additional intent unit to a second design element;

automatically updating the verification plan and testbench based on the linking.

15. A computer program product comprising a non-transitory computer readable medium storing a computer executable instructions executable to cause a computer to:

allow a user to define a set of intent units, including allowing the user to create a derived intent unit from a base intent unit such that the derived intent unit inherits one or more interfaces or processes from the base intent unit and the derived intent unit references the base intent unit, each intent unit comprising:

a code component including a first set of instructions operable to implement a set of tests for testing the design element corresponding the intent unit; and a text component comprising a second set of instructions operable to create a description of the set of tests couple multiple intent units together to form a composite intent unit;

provide a graphical user interface that allows users to associate intent units to specific design elements of an integrated circuit, wherein the specific design elements comprise constituent elements of the integrated circuit design;

generating a verification plan corresponding to the integrated circuit based upon each of the one or more intent units;

generate a testbench corresponding to the design of the integrated circuit based upon each of the one or more intent units, wherein generating a test bench comprises compiling the code components of the one or more intent units including code components of the intent units coupled together to form the composite intent unit.

16. The computer program product of claim 15, wherein at least one the intent unit comprises a template.

17. The computer program product of claim 16, wherein first set of instructions comprises a hardware verification language.

18. The computer program product of claim 17, wherein the first set of instructions comprises a set of data members, a set of interfaces corresponding to the design element, the set of interfaces including a set of ports.

19. The computer program product of claim 18, wherein the first set of instructions comprises a set of functions, a set of tasks, a set of sequences or a set of properties associated with each of the set of ports.

20. The computer program product of claim 19, wherein the first set of instructions comprises a set of processes and a set of intent features.

21. The computer program product of claim 20, wherein each intent feature represents a check, a coverage, a stimulus or an assumption.

22. The computer program product of claim 20, wherein the second set of instructions comprises a markup language.

23. The computer program product of claim 22, wherein the markup language comprises a first tag corresponding to a port, a second tag corresponding to a parameter and a third tag corresponding to a name of the intent unit.

24. The computer program product of claim 23, wherein the text component is a SystemVerilog comment.

25. A system for verifying integrated circuit design, comprising:
- a data store comprising a library of intent units;
- a computing device accessing a non-transitory computer readable medium having computer executable instructions embodied thereon operable for:
  defining a set of intent units, each intent unit comprising a code component and a text component, wherein the set of intent units comprises at least one base intent unit and at least one derived intent unit, the derived intent unit derived from the base intent unit and inheriting one or more interfaces or processes from the base intent unit, the derived intent unit referencing the base intent unit;
  coupling multiple intent units together to form a composite intent unit;
  providing a graphical user interface that allows users to associate intent units to specific design elements of an integrated circuit, wherein the specific design elements comprise constituent elements of the integrated circuit design;
  linking the one or more intent units including the composite intent unit to a design element of the integrated circuit based on input in the graphical user interface wherein the design element of the integrated circuit corresponds to the design element corresponding to the intent unit;
  generating a verification plan corresponding to the integrated circuit based upon each of the one or more intent units;
  generating a testbench corresponding to the design of the integrated circuit based upon each of the one or more intent units, wherein generating a test bench comprises compiling the code components of the one or more intent units including code components of the intent units coupled together to form the composite intent unit; and
  generating a test model from the testbench and a design component corresponding to the integrated circuit.

26. The system of claim 25, wherein the set of user interfaces can further allow a user to cause the verification plan, testbench of test model to be generated.

27. The system of claim 25, wherein the design component is stored in the data store.

* * * * *